United States Patent
Chaput

(10) Patent No.: US 7,342,713 B2
(45) Date of Patent: Mar. 11, 2008

(54) NON-INVERTING CROSS-GAIN MODULATION-BASED WAVELENGTH CONVERTER

(75) Inventor: Brian Chaput, Plano, TX (US)

(73) Assignee: Sanmina-SCI Corporation, San Jose, CA (US)

( * ) Notice: Subject to any disclaimer, the term of this patent is extended or adjusted under 35 U.S.C. 154(b) by 587 days.

(21) Appl. No.: 11/031,503

(22) Filed: Jan. 7, 2005

(65) Prior Publication Data

US 2006/0152798 A1    Jul. 13, 2006

(51) Int. Cl.
*H01S 3/00* (2006.01)
(52) U.S. Cl. ................................ 359/344; 359/332
(58) Field of Classification Search ............... 359/344, 359/332
See application file for complete search history.

(56) References Cited

U.S. PATENT DOCUMENTS

| | | | |
|---|---|---|---|
| 6,577,435 B1 * | 6/2003 | Bang et al. | 359/326 |
| 6,795,233 B2 * | 9/2004 | Bang et al. | 359/326 |
| 6,856,452 B2 * | 2/2005 | Kim et al. | 359/332 |
| 6,947,206 B2 * | 9/2005 | Tsadka et al. | 359/333 |

OTHER PUBLICATIONS

Renaud, M. et al., "SOA-based Optical Network Components," 2001 Electronic Components and Technology Conference, 2001, IEEE.

Munoz De La Corte, M. et al., "Accurate Noise Characterization of Wavelength Converters Based on XGM in SOAs," Journal of Lightwave Technology, Jan. 2003, pp. 182-197, vol. 21, No. 1, IEEE.

Elmirghani, J. et al., "All-Optical Wavelength Conversion: Technologies and Applications in DWDM Networks," IEEE Communications Magazine, Mar. 2000, pp. 86-92.

* cited by examiner

*Primary Examiner*—Mark Hellner
(74) *Attorney, Agent, or Firm*—Perkins Coie LLP

(57) ABSTRACT

Wavelength converter and methods are based on cross-gain modulation. The wavelength converter has two semiconductor optical amplifiers to perform double cross-gain modulations and double inversions. The first semiconductor optical amplifier performs a first cross-gain modulation on a first continuous wave light using the input light as a modulating light to generate an inverted first-stage cross-gain modulated light. The second semiconductor optical amplifier performs a second cross-gain modulation on a second continuous wave light using the first-stage cross-gain modulated light as a modulating light to generate a double-inverted output light. The output light is non-inverted with respect to the input light.

30 Claims, 5 Drawing Sheets

NON-INVERTING CROSS-GAIN MODULATION-BASED WAVELENGTH CONVERTER

BACKGROUND

1. Field of the Invention

The present invention relates generally to optical devices, and more particularly to cross-gain modulation type wavelength converters to change the wavelength of an incoming signal.

2. Description of the Prior Art

A wavelength converter converts a data signal at one wavelength to the same data signal at another wavelength. Wavelength converters are an important part of modern data communications networks. Wavelength converters are used when the wavelength of the carrier light wave needs to be changed at some points in the communications network.

There are two major types of wavelength converters used in digital data communications systems. The first type involves optical-electrical-optical (OEO) conversions in which the wavelength converter first converts an input light (optical) signal at an input wavelength to electrical signals, and then generates an output light (optical) signal at an output wavelength using the electric signals. Problems with OEO-based wavelength converters include high costs, complexity of electronic systems, and limited bandwidth. As the data bit rate continues to increase, the bandwidth limitation in particular is a growing barrier for OEO-based wavelength converters.

The second type of wavelength converters do not require OEO conversions but instead perform direct optical-to-optical conversions. This type of wavelength converters can generally be called optical wavelength converters. One known optical wavelength converter consists of a screen of luminescent material that absorbs radiation at a certain wavelength and radiates at a longer wavelength. Such materials are often used to convert ultraviolet light to visible radiation for detection by conventional photo tubes. This type of optical wavelength converters, however, are not highly suitable for converting wavelengths of coherent light sources. For this reason, these optical wavelength converters are more commonly used as scintillators in optical equipment such as X-ray spectroscopy than in digital data communications networks which primarily use coherent light sources (such as laser).

For coherent light sources used for carrying digital signals, wavelength conversion typically uses nonlinear optical techniques. This type of wavelength converters may generally be called nonlinear optical wavelength converters. One example of nonlinear optical wavelength converters is cross-gain modulation (XGM) wavelength converters that are based on XGM phenomena using a semiconductor optical amplifier (SOA). Because XGM is a form of optical gating, XGM wavelength converters operate based on optical gating technology. These devices use a modulated input signal to impress the data pattern onto a second laser-emitted light, which becomes a modulated output signal.

FIG. 1 is an illustration of an XGM wavelength converter in the prior art. The XGM wavelength converter has a semiconductor optical amplifier (SOA) 10. Input optical signal 12 at wavelength $\lambda_{in}$ enters through an optical coupler 14 into SOA 10 from one side. A continuous wave light 16 at wavelength $\lambda_c$ generated by a continuous wave light source 18 enters SOA 10 from an opposite side.

SOA 10 is essentially a semiconductor laser with antireflection coated facets that amplify the injected continuous wave light 16 by means of stimulated emission. The amplification is based on the XGM phenomenon in which the continuous wave light 16 is cross-gain modulated by the input optical signal 12. Specifically, SOA 10 operates within a region of saturation, in which the amplification gain of the continuous wave light 16 varies inversely with the degree of saturation. Because the degree of saturation increases as the input power of the input optical signal 12 increases, the amplification gain of the continuous wave light 16 varies inversely with the input power of the input optical signal 12. At the same time, because the intensity of the input optical signal 12 is modulated with optical pulses representing input digital data, SOA 10 outputs an output optical signal 20 which is inversely modulated with optical pulses. The output optical signal 20 has the same wavelength $\lambda_c$ as the continuous wave light 16, thus effectuating a wavelength conversion from $\lambda_{in}$ to $\lambda_c$. XGM-based wavelength converters shown in FIG. 1 have advantages of low-cost, simplicity and increasing flexibility and bandwidth.

Several problems still exist with prior art XGM-based wavelength converters shown in FIG. 1. One problem is that cross-gain modulation (XGM) inverts the output signal with respect to the input signal. Specifically, a pulse representing a bit "1" in the input signal becomes a bit "0" in the output signal, while a pulse representing a bit "0" in the input signal becomes a bit "1" in the output signal. This inversion often necessitates further data manipulation. Another problem is that XGM exhibits uneven conversion among different wavelengths, and accordingly an XGM-based wavelength converter has an output performance which is wavelength dependent.

FIG. 2 is a diagram showing a wavelength-dependent gain curve associated with a semiconductor optical amplifier operating at wavelength band around 1550 nm. As shown in the curve, the gain is the highest near the center of the band but lower in other regions, and the lowest at two ends (1500 nm and 1590 nm) of the band.

Both the above identified problems are inherent to single cross-gain modulation.

SUMMARY OF THE INVENTION

The invention addresses the above problems by providing a wavelength converter and a method for converting wavelength of an optical data signal based on a double cross-gain modulation (XGM). The wavelength converter has two semiconductor optical amplifiers (SOAs) to perform a two-stage XGM modulation. The first SOA performs a first cross-gain modulation on a first continuous wave light using an input light having an input wavelength for modulation. The first cross-gain modulation produces a first-stage cross-gain modulated light. The second SOA performs a second cross-gain modulation on a second continuous wave light using the first-stage cross-gain modulated light for modulation. The second cross-gain modulation produces an output light which has an output wavelength.

In one embodiment, the input light is an optical data signal with input signal modulations. The wavelength converter performs double cross-gain modulations and double inversions on the signal modulations to result in output signal modulations which are non-inverted with respect to the input signal modulations.

In one embodiment, the first SOA receives the input light and the first continuous wave light in two counter-propagating directions. In another embodiment, the first SOA receives the input light and the first continuous wave light from a co-propagating direction.

In one embodiment, the second SOA receives the first-stage cross-gain modulated light and the second continuous wave light in two counter-propagating directions. In another embodiment, the second SOA receives the first-stage cross-gain modulated light and the second continuous wave light in a co-propagating direction.

In some embodiments, the wavelength converter has an optical amplifier that amplifies the first-stage cross-gain modulated light before the second SOA receives the first-stage cross-gain modulated light. In these embodiments, the wavelength converter may further have a pump drive circuit that prepares the first-stage cross-gain modular light for pumping the second SOA during the second cross-gain modulation.

In one embodiment, the wavelength converter has a variable optical amplifier selectively amplifies the second continuous wave light before the second SOA receives the second continuous wave light. The variable optical amplifier may selectively amplify the second continuous wave light according to a wavelength profile in order to attain an approximately uniform output intensity gain across a range of wavelengths of the output light.

The method of the present invention uses the wavelength converter to convert wavelength of an optical data signal. When the output optical data signal has an output wavelength which is different from the input wavelength of the input optical data signal, the wavelength conversion is accomplished.

In one embodiment of the method, the first continuous wave light has a transitional wavelength which is the same as the input wavelength. In another embodiment, the first continuous wave light has a transitional wavelength which is the same as the output wavelength.

In some embodiments, the method amplifies the transitional optical data signal using an optical amplifier before the second SOA receives the transitional optical data signal.

The wavelength converter and the method advantageously convert the wavelength of an input optical data signal. The wavelength converter and the method are capable of generating an output optical data signal having signal modulations which are non-inverted with respect to the original signal modulations of the input optical data signal. The wavelength converter and the method may also be adapted for compensating the wavelength-dependent gain variance suffered by prior art XGM-based wavelength converters. The wavelength converter and the method can be used for converting wavelengths of optical data signals in various situations and nodes in optical communication systems.

DETAILED DESCRIPTION OF THE INVENTION

The present inventions provide a wavelength converter and a method for changing the wavelength of an optical signal. Those skilled in the art will recognize that various features disclosed in connection with the embodiments may be used either individually or jointly. It is to be appreciated that while the present inventions have been described with reference to preferred implementations, those having ordinary skill in the art will recognize that the present inventions may be beneficially utilized in any number of environments and implementations.

The inventions have been described below with reference to specific embodiments. It will be readily appreciated by those skilled in the art that various modifications may be made and other embodiments can be used without departing from the broader scope of the inventions. Therefore, these and other variations upon the specific embodiments are intended to be covered by the present inventions.

The invention provides a wavelength converter and a method for converting wavelength of an optical data signal based on cross-gain modulation (XGM). The wavelength converter has two semiconductor optical amplifiers to perform double cross-gain modulations and double inversions. The first semiconductor optical amplifier performs a first cross-gain modulation on a first continuous wave light using the input light as a modulating light to generate an inverted first-stage cross-gain modulated light. The second semiconductor optical amplifier performs a second cross-gain modulation on a second continuous wave light using the first-stage cross-gain modulated light as a modulating light to generate a double-inverted output light. The output light is non-inverted with respect to the input light. Several exemplary embodiments of the present invention are illustrated below with references to FIGS. 3-5.

Figure 1:
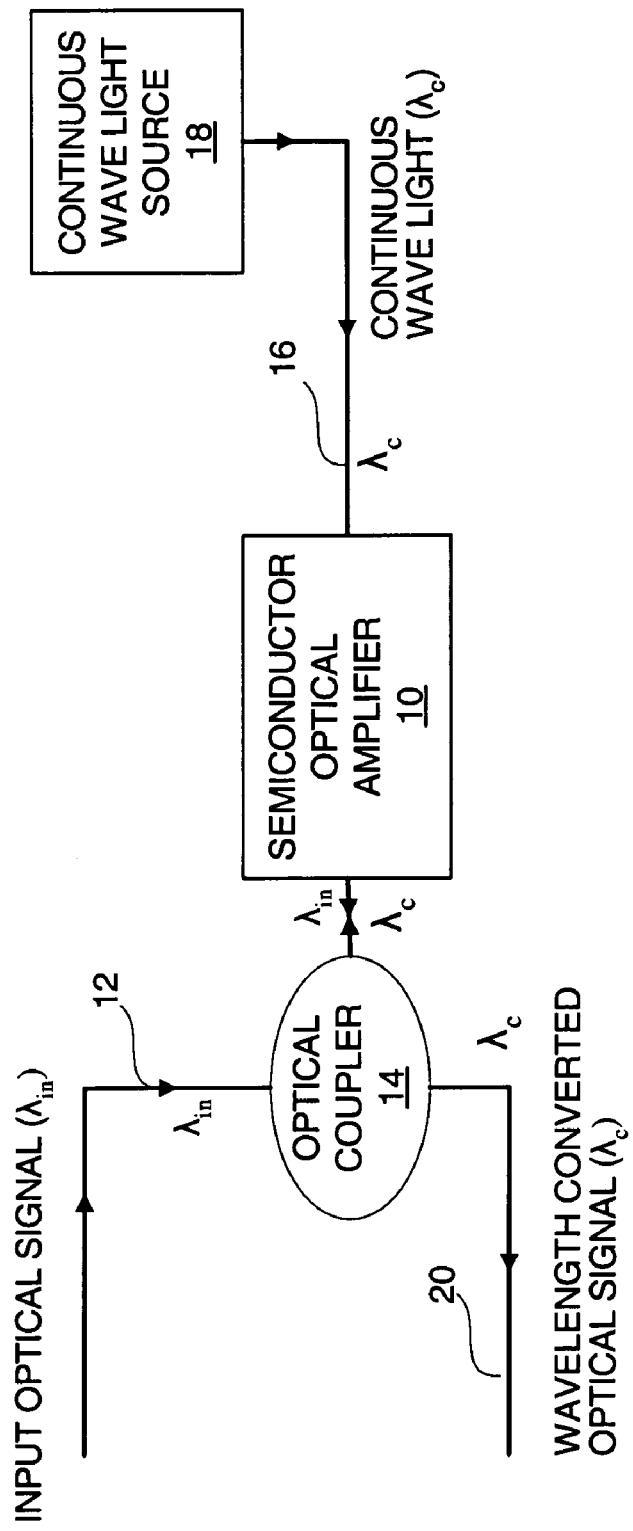
FIG. 1 is a block diagram of an XGM-based wavelength converter in the prior art.
Figure 2:
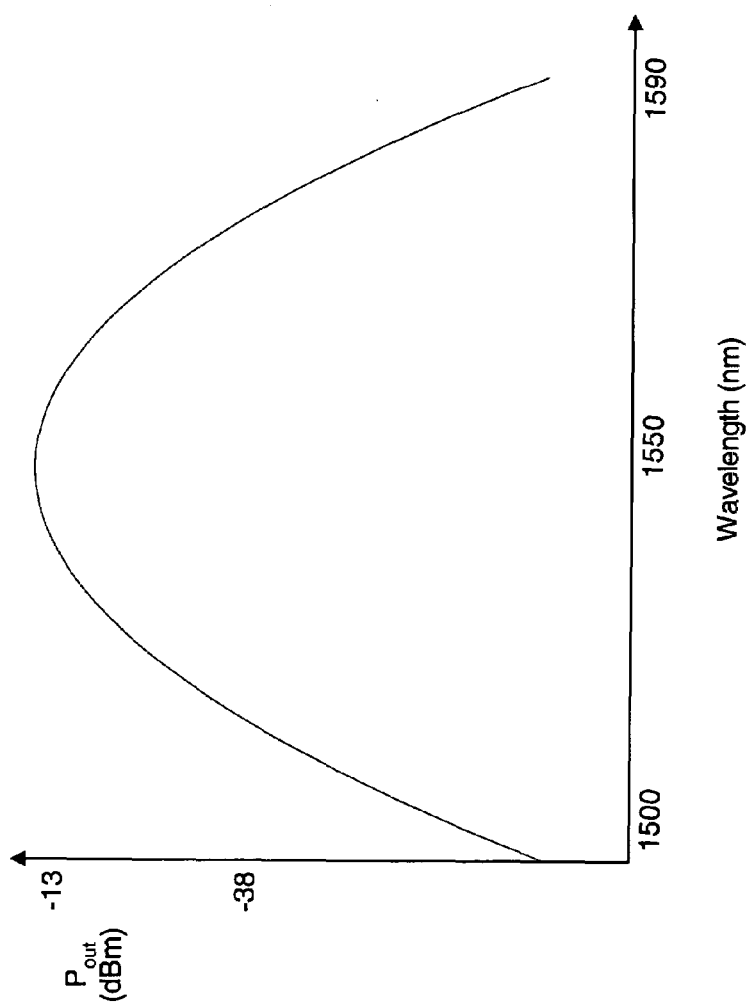
FIG. 2 is a diagram showing a wavelength-dependent gain curve associated with a semiconductor optical amplifier operating at wavelength band around 1550 nm in the prior art.
Figure 3:
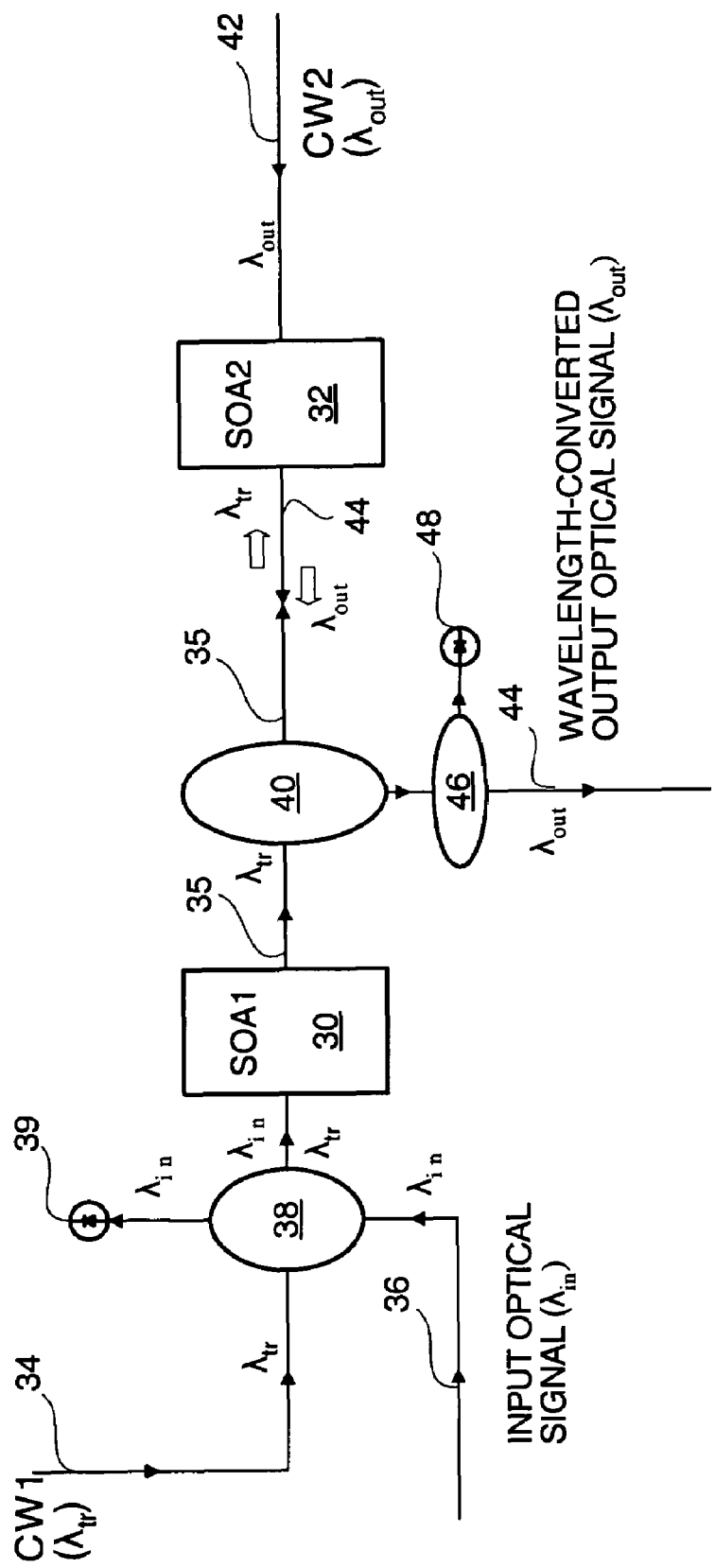
FIG. 3 is a block diagram of a wavelength converter in one embodiment of the present invention.

FIG. 3 is a block diagram of a wavelength converter in one embodiment of the present invention. The wavelength converter has a first semiconductor optical amplifier (SOA1) 30 and a second semiconductor optical amplifier (SOA2) 32. The wavelength converter also has optical couplers/circulators 38, 40 and 46, and photodiodes 39 and 48. The optical coupler/circulator 38 is placed before the first semiconductor optical amplifier 30. Entering from the left side (through the optical coupler/circulator 38 and into the first semiconductor optical amplifier 30) are a first continuous wave 34 at wavelength $\lambda_{tr}$ and an input optical signal 36 at $\lambda_{in}$. Entering from the right side (into the second semiconductor optical amplifier 32) is a second continuous wave 42 at wavelength $\lambda_{out}$.

A Semiconductor Optical Amplifier (SOA) is a laser diode without end mirrors coupled to optical fibers on both ends. Light coming in either fiber is amplified by a single pass through the laser diode.

An optical coupler is an optical device capable of branching an optical power on a single optical fiber into two in a designated ratio, or vice versa (i.e., combining the optical powers on two optical fibers into one). Optical couplers are also known as optocouplers or photocouplers. An optical circulator is a unidirectional device that directs an optical signal (light) from one port to the next, in only one direction at a time. While the direction of the light may be redirected as needed, in an optical circulator it generally passes to and from ports sequentially (e.g., from port 1 to port 2 before traveling to port 3). An optical circulator is often used to direct light from port to port sequentially and non-reciprocally in one direction, but in advanced optical communications systems such as WDM (wavelength division multiplexing) networks and fiber amplifier systems, optical circulators are also used for bidirectional transmissions.

It is appreciated that, depending on the intended function (e.g., power tapping, signal coupling, splitting or direction), wavelengths involved and the type of multiplexing scheme used, the optical couplers/circulators 38, 40 and 46 can be a coupler, a splitter, a WDM coupler, a circulator, or a combination thereof.

The first continuous wave light (CW1) 34 at wavelength $\lambda_{tr}$ and the input optical signal 36 at an input wavelength $\lambda_{in}$ pass through the optical coupler/circulator 38 before being sent into the first semiconductor optical amplifier 30. The optical coupler/circulator 38 combines the first continuous wave light 34 and the input optical signal 36 and feeds the combined signals to the first semiconductor optical amplifier 30. The optical coupler/circulator 38 also branches a portion of the input optical signal 36 to the photodiode 39 which passively monitors input powers.

A photodiode is a photoelectric semiconductor device for detecting and often measuring radiant energy (such as light). Photodiodes may also be used for the conversion of optical power to electrical power. In some embodiments, a photodiode is a two-electrode, radiation-sensitive junction formed in a semiconductor material in which the reverse current varies with illumination.

Upon receiving the first continuous wave light 34 and the input optical signal 36, the first semiconductor optical amplifier 30 performs a first cross-gain modulation on the first continuous wave light 34. To do this, the first semiconductor optical amplifier 30 operates in a saturation region in which the intensity of the input optical signal 36 inversely affects the intensity gain of the first continuous wave light 34. Specifically, the intensity gain of the first continuous wave light 34 decreases as the intensity of the input optical signal 36 increases, and vice versa. Because the input optical signal 36 is a digital data signal with intensity pulse modulations, its intensity pulse modulations inversely modulate the first continuous wave light 34 during the first cross-gain modulation. The first semiconductor optical amplifier 30 thus generates a first-stage cross-gain modulated signal 35 with intensity pulse modulations inverted with respect to the modulations of the input optical signal 36.

Cross-gain modulation (XGM) is a technique used in wavelength converters where gain saturation effects in an optical device, such as a semiconductor optical amplifier (SOA), allow the conversion of the optical wavelength. In an exemplary set up for XGM, an input pump data signal is externally modulated through a Mach-Zhender intensity modulator. A continuous wave light signal from a tunable laser is coupled to the data signal on a passive optical coupler. The signals are then injected to the SOA through an optical circulator.

The first-stage cross-gain modulated signal 35 passes through the optical coupler/circulator 40 to enter the second semiconductor optical amplifier 32. The second continuous wave light (CW2) 42 at wavelength $\lambda_{out}$ enters into the second semiconductor optical amplifier 32 from an opposite side.

Upon receiving the second continuous wave light 42 and the first-stage cross-gain modulated signal 35, the second semiconductor optical amplifier 32 performs a second cross-gain modulation on the second continuous wave light 42 using the first stage cross-gain modulated light 35 as modulating light. As in the case of the first cross-gain modulation occurred in the first semiconductor optical amplifier 30, the second semiconductor optical amplifier 32 operates in a region of saturation in which the intensity of the incoming first-stage cross-gain modulated signal 35 inversely modulates the intensity gain of the second continuous wave light 42. The second semiconductor optical amplifier 32 thus generates an output optical signal 44 which has re-inverted signal modulations. As a result of this double inversion, the signal modulations of the output optical signal 44 are noninverting with respect to the original signal modulations of the input optical signal 36. The wavelength of the output optical signal 44 is the same as the wavelength $\lambda$out of the second continuous wave 42. When $\lambda_{out}$ is different from the wavelength $\lambda_{in}$ of the input optical signal 36, a wavelength conversion from $\lambda_{in}$ to $\lambda_{out}$ is accomplished. It is appreciated that the wavelength $\lambda_{tr}$ of the first continuous wave 34 (and of the first-stage cross-gain modulated light 35) is transitional and may be any value in principle. For example, $\lambda_{tr}$ may be the same as $\lambda_{in}$. $\lambda_{tr}$ may also be the same as $\lambda_{out}$.

The output optical signal 44 and the incoming first-stage cross-gain modulated signal 35 both pass through the optical coupler/circulator 40, which branches the output optical signal 44 to a separate port to send it to the optical coupler/circulator 46, where the output optical signal 44 is further branched with a portion thereof sent to the photodiode 48 for monitoring.

It is also appreciated that other components such as control electronics, interface control circuits, thermal loops and optical loops may be used for refinement, adjustment and additional functions. For example, an off-board laser feedback circuit may be used to guarantee stable continuous wave light input power for either or both the first continuous wave light 34 and the second continuous wave light 42. For another example, a pump drive circuit may be added to the wavelength converter in FIG. 3 to maintain a proper saturation status of the first semiconductor optical amplifier 30 and/or the second semiconductor optical amplifier 32.

In addition, a variable optical amplifier (VOA) may be added to perform wavelength-dependent amplification at various points of the signal path, such as on the first continuous wave light 34 before it enters the first semiconductor optical amplifier 30, on the first-stage cross-gain modulated signal 35 before it enters the second semiconductor optical amplifier 32, or on the output optical signal 44 after it has left the second semiconductor optical amplifier 32. The VOA may perform selective and adjustable amplification to compensate wavelength-dependent gain variance in the first cross-gain modulation and/or the second cross-gain modulation. With proper compensation, the wavelength converter can achieve an approximately uniform output intensity gain across a range of wavelengths of the output optical signal 36 and/or the output optical signal 44. To do this, the amplification may be adjusted according to wavelength profiles characterizing the wavelength-dependent gain variances of the first semiconductor optical amplifier 30 and/or the second semiconductor optical amplifier 32. This can either be done using pre-characterized wavelength profiles or performed on-the-fly based on real-time measurements of the input and output powers.

In the present application, the terms "optical wave" and "light" are used interchangeably. An optical wave or a light may be transmitted on an optical fiber system.

In the embodiment shown in FIG. 3, the first continuous wave light of 34 and the input optical signal 36 enter the first semiconductor optical amplifier 30 from the same side and co-propagate within the first semiconductor optical amplifier 30. As a result, output signals of the first semiconductor optical amplifier 30 may include both the first-stage cross-gain modulated signal 35 and the outgoing input optical signal 36. In this case, a bandpass filter (not shown) may be used for separating these two signals. The need of a bandpass filter can be avoided by using a counter-propagating design as shown in FIG. 4 below.

Figure 4:
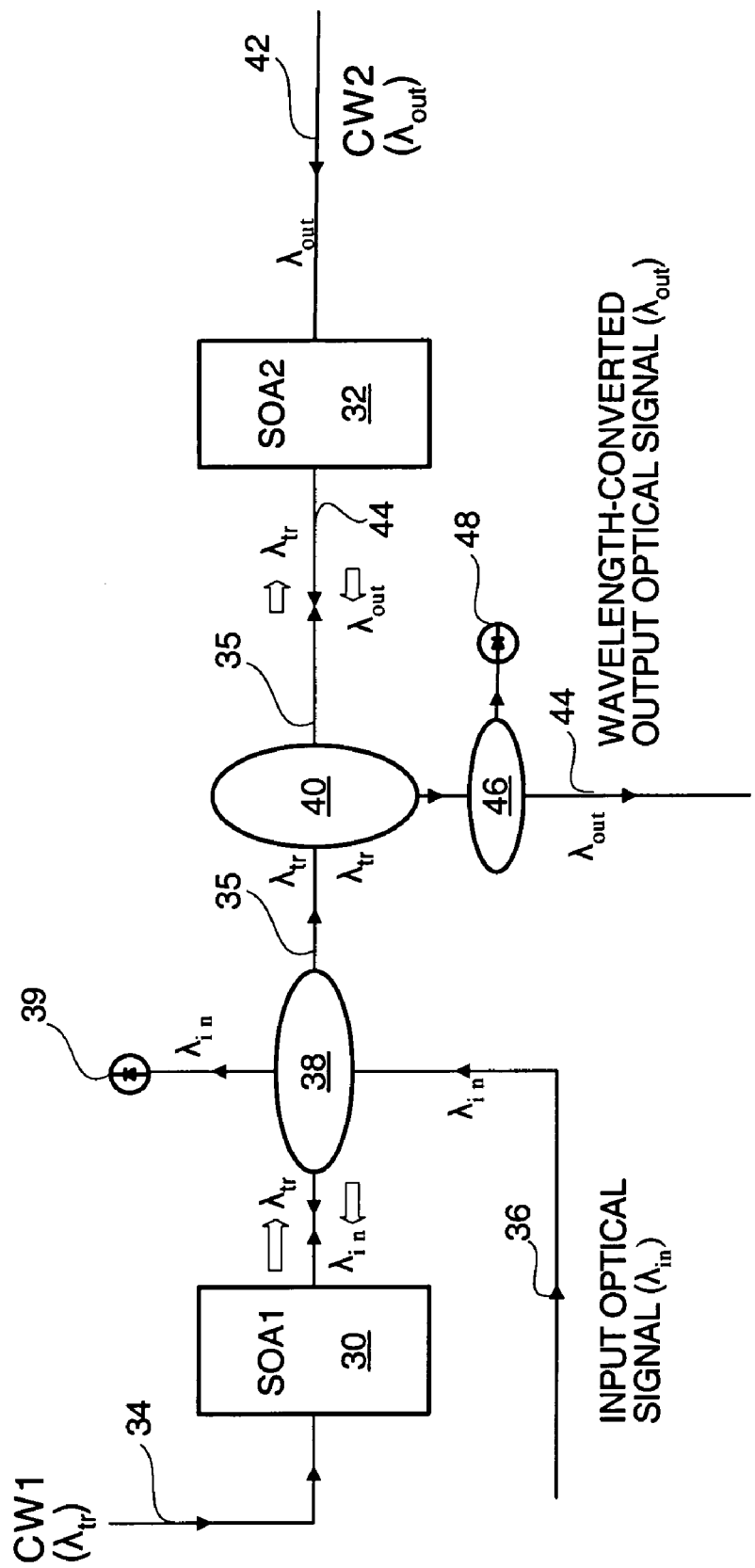
FIG. 4 is a block diagram of a wavelength converter in another embodiment of the present invention.

FIG. 4 is a block diagram of a wavelength converter in an alternative embodiment of the present invention. Many components of a wavelength converter in FIG. 4 are the same as that in the wavelength converter shown in FIG. 3. These components include the first semiconductor optical amplifier 30, the second semiconductor optical amplifier 32, optical couplers/circulators 38, 40 and 46, and photodiodes 39 and 48. As that in the wavelength converter shown in FIG. 3, optical couplers/circulators 38, 40 and 46 can be an optical circulator, a splitter, a WDM coupler, or the like, depending on the intended function, wavelengths involved and the multiplexing scheme.

Unlike the wavelength converter in FIG. 3, however, in FIG. 4 the input optical signal 36 and the first continuous wave light 34 enter the first semiconductor optical amplifier 30 from opposite sides and counter-propagate within the first semiconductor optical amplifier 30. The optical coupler/circulator 38 directs, combines or branches the input optical signal 36 and the first-stage cross-gain modulated signal 35 after the signals have left the first semiconductor optical amplifier 30. (In comparison, in FIG. 3 the optical coupler/circulator 38 directs, combines or branches the input optical signal 36 and the first continuous wave light 34 before the signals the first semiconductor optical amplifier 30.)

In the above counter-propagating scheme, the first-stage cross-gain modulated signal 35 leaves the first semiconductor optical amplifier 30 separately without being mixed with the input optical signal 36. The wavelength converter in FIG. 4 therefore does not require a bandpass filter to be placed after the first semiconductor optical amplifier 30.

It is appreciated that the second semiconductor optical amplifier 32 may also be either in a co-propagating mode or a counter-propagating mode as illustrated above with respect to the first semiconductor optical amplifier 30.

Figure 5:
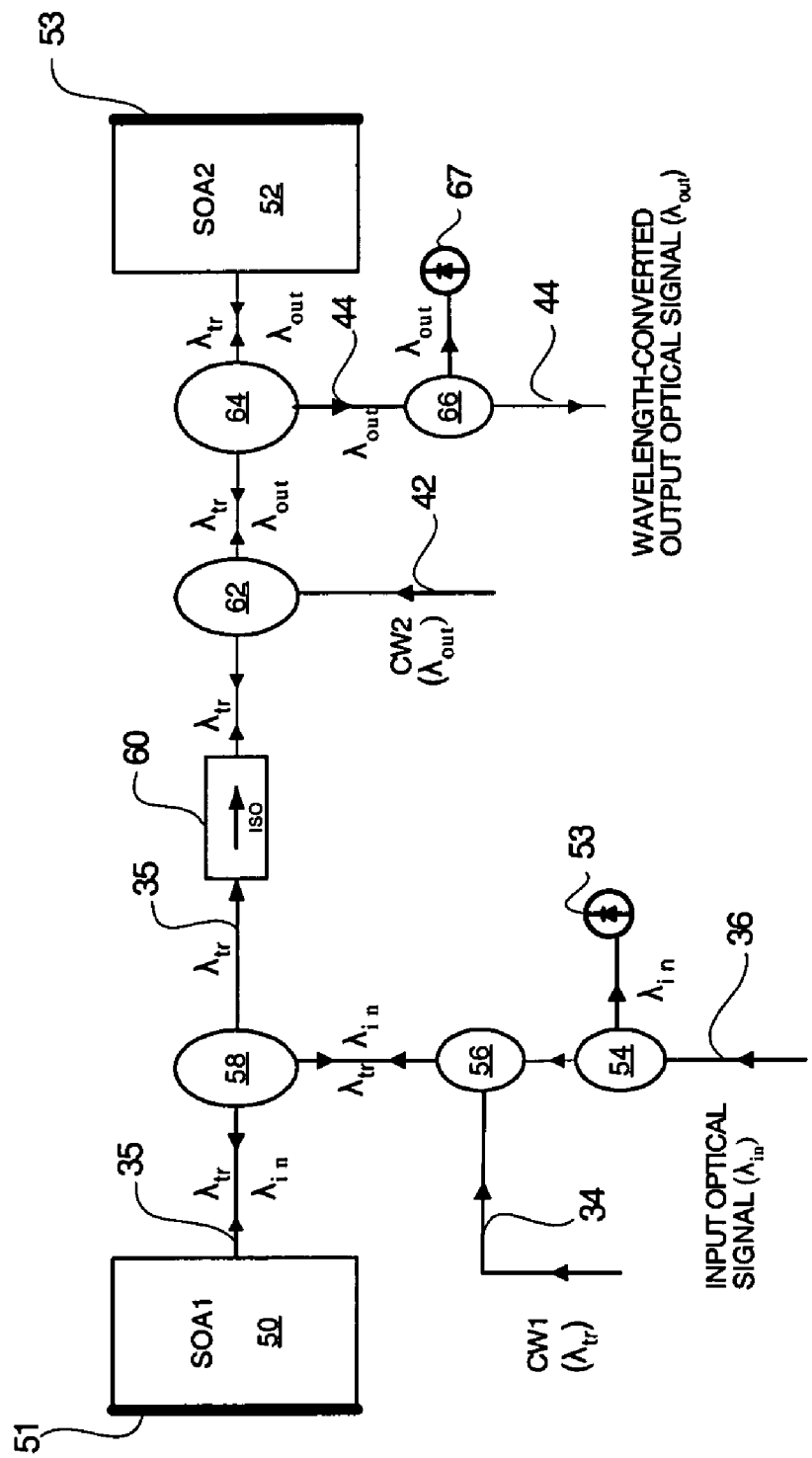
FIG. 5 is a block diagram of a wavelength converter in another embodiment of the present invention.

FIG. 5 is a block diagram of a wavelength converter in another embodiment of the present invention. This embodiment achieves an operation mode similar to the "co-propagation" mode in FIG. 3 but has a different optical path/configuration by using reflective semiconductor optical amplifiers that lead to an effect as seen in Michelson Interferometers. As shown in FIG. 5, the wavelength converter in this embodiment has a first reflective semiconductor optical amplifier (SOA1) 50 and a second reflective semiconductor optical amplifier (SOA2) 52. The first reflective semiconductor optical amplifier 50 has reflective coating 51 on one side and both input and output ports on the other side. Similarly, the second reflective semiconductor optical amplifier 52 has reflective coating 53 on one side and both input and output ports on the other side. The wavelength converter also has optical circulators/couplers 54, 56, 58, 62, 64 and 66, an optical isolator 60, and photodiodes 53 and 67. The input optical signal 36 at $\lambda_{in}$ and the first continuous wave light (CW1) 34 at $\lambda_{tr}$ pass through the optical circulators/couplers 54, 56 and 58 to enter the first reflective semiconductor optical amplifier (SOA1) 50.

Upon receiving the first continuous wave light 34 and the input optical signal 36, the first reflective semiconductor optical amplifier 50 performs a first cross-gain modulation on the first continuous wave light 34. The intensity pulse modulations of the input optical signal 36 inversely modulate the first continuous wave light 34 during the first cross-gain modulation. The first semiconductor optical amplifier 50 thus generates a first-stage cross-gain modulated signal 35 with intensity pulse modulations inverted with respect to the modulations of the input optical signal 36. Because of the reflective coating 51, the first-stage cross-gain modulated signal 35 propagates in a direction opposite to the incoming direction of the first continuous wave light 34. The first-stage cross-gain modulated signal 35 leaves the first reflective semiconductor optical amplifier 50, passes through the circulator/coupler 58, the optical isolator 60, and the circulators/couplers 62 and 64 to enter the second reflective semiconductor optical amplifier (SOA2) 52. At the same time, the second continuous wave light (CW2) 42 passes through the optical circulators/couplers 62 and 64 to also enter the second reflective semiconductor optical amplifier 52.

Upon receiving the first-stage cross-gain modulated signal 35 and the second continuous wave light 42, the second reflective semiconductor optical amplifier 52 performs a second cross-gain modulation on the second continuous wave light 42 using the first stage cross-gain modulated light 35 as modulating light. In the second cross-gain modulation, the intensity of the incoming first-stage cross-gain modulated signal 35 inversely modulates the intensity gain of the second continuous wave light 42. The second semiconductor optical amplifier 32 thus generates an output optical signal 44 which has re-inverted signal modulations. As a result of this double inversion, the signal modulations of the output optical signal 44 are noninverting with respect to the original signal modulations of the input optical signal 36. The wavelength of the output optical signal 44 is the same as the wavelength $\lambda_{out}$ of the second continuous wave 42. When $\lambda_{out}$ is different from the wavelength $\lambda_{in}$ of the input optical signal 36, a wavelength conversion from $\lambda_{in}$ to $\lambda_{out}$ is accomplished.

Because of the reflective coating 53, the output optical signal 44 propagates in a direction opposite to the incoming direction of the first-stage cross-gain modulated signal 35. The output optical signal 44 leaves the second reflective semiconductor optical amplifier 52, passes through the circulators/couplers 64 and 66. The circulator/coupler 66 branches a portion of the output optical signal 44 to the photodiode 67 for monitoring purpose and passes the rest of the output optical signal 44 as the wavelength-converted output optical signal.

The wavelength converter and method of the present the invention overcomes several shortcomings of prior art wavelength converters based on cross-gain modulation. Some embodiments of the wavelength converter have an advantage of relative simplicity in design. Some embodiments have an advantage of quick and simple implementation. Some embodiments have an advantage of polarization independence. Some embodiments have an advantage of high-bandwidth. Some embodiments have an advantage of −3 dB input power requirement. Some embodiments have an advantage of flexibility of two-stage amplification. In some embodiments, the wavelength converter is capable of performing bit error rate (BER) penalty free conversions. In some embodiments, the wavelength converter may have the advantage of low costs. Although the cost of fabricating the wavelength converter of the present invention is expected to be higher than that of a wavelength converter using a single SOA, the cost is still expected to be low.

The wavelength converter and the method for converting wavelength may use any suitable semiconductor optical amplifiers either existing today or becoming available in the future. For each semiconductor optical amplifier in the wavelength converter, any suitable light propagation scheme, including counter-propagation and co-propagation as illustrated herein, may be used. The wavelength converter may perform either up-conversions which increase the wavelength or down-conversions which decrease the wavelength.

The wavelength converter in accordance with some embodiments is capable of performing interband conversions, such as between the "O-band" centered near 1310 nm and the standard "C-band" centered near 1550 nm, or other bands including "S-band", "E-band", "L-band" and "U-band." The wavelength converter is also capable of performing reverse interband conversions and intraband conversions. In some applications, the wavelength may be converted back to the original wavelength of the input optical signal by deploying two wavelength converters at two different locations.

The wavelength converter of the present invention can be implemented in a telecommunications systems network node to allow for fiber channel switching in a nonblocking and non-OEO (i.e., all optical) conversion manner. For example, wavelength converters performing interband conversions can be deployed at an edge of a network where the wavelengths need to be changed for legacy or custom related reasons. If most signal channels need wavelength conversion, a dedicated architecture using an array of wavelength converters in accordance with the present invention may be implemented. In this implementation, incoming signals are first de-multiplexed. The demultiplexed signals pass through optical switches. The wavelength converters each dedicated to a channel then convert the wavelengths of all channels that require wavelength conversion. The converted signals are then multiplexed and sent to the next node. If only some of the channels need wavelength conversion, more efficient architectures for the network nodes, such as share-per-node, share-per-link, and half-clear modes, are available for use in wavelength converters. In these architectures, a wavelength converter can be shared by channels within the same node or channels within the same link.

In addition to performing wavelength conversion, the wavelength converter of some embodiments is also capable of performing signal regeneration to improve signal integrity.

The above description is illustrative and not restrictive. Many variations of the invention will become apparent to those of skill in the art upon review of this disclosure. The scope of the invention should, therefore, be determined not with reference to the above description, but instead should be determined with reference to the appended claims along with their full scope of equivalents.

What is claimed is:

1. A wavelength converter comprising:
a first semiconductor optical amplifier configured to perform a first cross-gain modulation on a first continuous wave light using an input light having an input wavelength for modulating, the first cross-gain modulation producing a first-stage cross-gain modulated light; and
a second semiconductor optical amplifier configured to perform a second cross-gain modulation on a second continuous wave light using the first-stage cross-gain modulated light for modulating, the second cross-gain modulation producing an output light having an output wavelength.

2. The wavelength converter of claim 1 wherein the input light is an optical data signal with input signal modulations.

3. The wavelength converter of claim 1 wherein the output light has output signal modulations which are non-inverted with respect to the input signal modulations.

4. The wavelength converter of claim 3 wherein the first semiconductor optical amplifier is further configured to invert signal modulations during the first cross-gain modulation, and the second semiconductor optical amplifier is further configured to re-invert the signal modulations during the second cross-gain modulation.

5. The wavelength converter of claim 1 wherein the first semiconductor optical amplifier is further configured to receive the input light and the first continuous wave light in two counter-propagating directions.

6. The wavelength converter of claim 5 further comprising an optical coupler/circulator configured to couple the input light and the first-stage cross-gain modulated light.

7. The wavelength converter of claim 1 wherein the first semiconductor optical amplifier receives the input light and the first continuous wave light from a co-propagating direction.

8. The wavelength converter of claim 7 further comprising an optical coupler/circulator configured to couple the input light and the first continuous wave light.

9. The wavelength converter of claim 1 wherein the second semiconductor optical amplifier is configured to receive the first-stage cross-gain modulated light and the second continuous wave light in two counter-propagating directions.

10. The wavelength converter of claim 8 further comprising an optical coupler/circulator configured to couple the first-stage cross-gain modulated light and the output.

11. The wavelength converter of claim 1 wherein the second semiconductor optical amplifier is configured to receive the first-stage cross-gain modulated light and the second continuous wave light in a co-propagating direction.

12. The wavelength converter of claim 1 further comprising an optical amplifier configured to amplify the first-stage cross-gain modulated light before the second semiconductor optical amplifier receives the first-stage cross-gain modulated light.

13. The wavelength converter of claim 12 further comprising a pump drive circuit configured to prepare the first-stage cross-gain modular light for modulating in the second semiconductor optical amplifier during the second cross-gain modulation.

14. The wavelength converter of claim 1 further comprising a variable optical amplifier configured to selectively amplify the second continuous wave light before the second semiconductor optical amplifier receives the second continuous wave light.

15. The wavelength converter of claim 14 wherein the variable optical amplifier is configured to selectively amplify the second continuous wave light according to a wavelength profile in order to attain an approximately uniform output intensity gain across a range of wavelengths of the output light.

16. The wavelength converter of claim 1 wherein at least one of the first semiconductor optical amplifier and the second semiconductor optical amplifier comprises an optical reflector to change a light direction.

17. The wavelength converter of claim 16 where in the optical reflector is disposed on a side opposing an input port of the at least one of the first semiconductor optical amplifier and the second semiconductor optical amplifier.

18. The wavelength converter of claim 1 wherein the first semiconductor optical amplifier and the second semiconductor optical amplifier each comprises an optical reflector to change a light direction.

19. The wavelength converter of claim 1 wherein at least one of the first semiconductor optical amplifier and the second semiconductor optical amplifier is configured to receive and output light on a common side thereof.

20. An apparatus for generating an output light having an output wavelength using an input light having an input wavelength which is different from the output wavelength, wherein the output light carries output data signal modulations which are non-inverted with respect to input data signal modulations carried by the input light, the apparatus comprising:

a first cross-gain modulation unit having a first semiconductor optical amplifier configured to cross-gain modulate a first continuous wave light having a transitional wavelength to generate a transitional cross-gain modulated light which has inverted data signal modulations; and a second cross-gain modulation unit having a second semiconductor optical amplifier configured to cross-gain modulate a second continuous wave light having the output wavelength to generate the output light which has re-inverted data signal modulations.

21. A method for converting wavelength of an input optical data signal, the method comprising:

receiving the input optical data signal and a first continuous wave light into a first semiconductor optical amplifier;

in the first semiconductor optical amplifier, performing a first cross-gain modulation on the first continuous wave light using the input optical data signal for modulating to generate a transitional optical data signal;

receiving the transitional optical data signal and a second continuous wave light into a second semiconductor optical amplifier; and in the second semiconductor optical amplifier, performing a second cross-gain modulation on the second continuous wave light using the transitional optical data signal for modulating to generate an output optical data signal.

22. The method of claim 21 wherein the input optical data signal has an input wavelength and the output optical data signal has an output wavelength which is different from the input wavelength.

23. The method of claim 22 wherein the first continuous wave light has a transitional wavelength which is the same as the input wavelength.

24. The method of claim 22 wherein the first continuous wave light has a transitional wavelength which is the same as the output wavelength.

25. The method of claim 21 wherein the first semiconductor optical amplifier receives the input optical data signal and the first continuous wave light from two counter-propagating directions.

26. The method of claim 21 wherein the second semiconductor optical amplifier receives the transitional optical data signal and the second continuous wave light from two counter-propagating directions.

27. The method of claim 21 further comprising:

amplifying the transitional optical data signal using an optical amplifier before the second semiconductor optical amplifier receives the transitional optical data signal.

28. The method of claim 21 further comprising:

passing the transitional optical data signal through a pump drive circuit to prepare the transitional optical data signal for modulating in the second semiconductor optical amplifier during the second cross-gain modulation.

29. The method of claim 21 further comprising:

amplifying the second continuous wave light using a variable optical amplifier before the second continuous wave light reaches the second semiconductor optical amplifier.

30. The method of claim 29 wherein the step of amplifying the continuous wave light is performed according to a wavelength profile to achieve an approximately uniform output intensity gain across a range of wavelengths of the output optical data signal.

* * * * *